United States Patent
Yonekubo et al.

(10) Patent No.: US 9,042,562 B2
(45) Date of Patent: May 26, 2015

(54) AUDIO CONTROLLING APPARATUS, AUDIO CORRECTION APPARATUS, AND AUDIO CORRECTION METHOD

(75) Inventors: Hiroshi Yonekubo, Tokyo (JP); Hirokazu Takeuchi, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 486 days.

(21) Appl. No.: 13/413,474

(22) Filed: Mar. 6, 2012

(65) Prior Publication Data

US 2012/0328125 A1 Dec. 27, 2012

(30) Foreign Application Priority Data

Jun. 24, 2011 (JP) .................................. 2011-141098

(51) Int. Cl.
H04R 29/00 (2006.01)
H03G 3/20 (2006.01)
H03G 3/32 (2006.01)
H03G 5/16 (2006.01)
H04H 40/18 (2008.01)

(52) U.S. Cl.
CPC ................. *H03G 3/32* (2013.01); *H04H 40/18* (2013.01); *H03G 5/165* (2013.01)

(58) Field of Classification Search
CPC ......... H03G 3/30; H03G 3/32; H03G 3/3005; H03G 3/3089; H03G 3/301; H03G 9/025; H03G 7/00; H03G 7/002; H03G 7/007; H03G 5/165; H03G 5/005; H03G 11/008; H04S 7/307
USPC ........... 381/107, 56–57, 94.1, 103–104, 71.1, 381/110, 102; 700/94
See application file for complete search history.

(56) References Cited

U.S. PATENT DOCUMENTS

| 5,450,035 A * | 9/1995 | Kinoshita ...................... 330/129 |
| 2004/0019481 A1* | 1/2004 | Saito .............................. 704/224 |
| 2007/0147554 A1* | 6/2007 | Yoshida ......................... 375/345 |
| 2010/0085117 A1* | 4/2010 | Moon et al. ................... 330/149 |
| 2010/0158261 A1* | 6/2010 | Takeuchi et al. ................ 381/56 |
| 2010/0166225 A1* | 7/2010 | Watanabe et al. ............. 381/107 |
| 2010/0202631 A1* | 8/2010 | Short ............................ 381/104 |

FOREIGN PATENT DOCUMENTS

| JP | 10-178695 | 6/1998 |
| JP | 2000-022470 | 1/2000 |
| JP | 2008-228198 | 9/2008 |

OTHER PUBLICATIONS

European Patent Application No. 12152196.7-1247, European Search Report, mailed Jul. 17, 2012.

* cited by examiner

*Primary Examiner* — Xu Mei
(74) *Attorney, Agent, or Firm* — Blakely Sokoloff Taylor & Zafman LLP

(57) ABSTRACT

According to one embodiment, an audio controlling apparatus includes a first receiver configured to receive audio signal, a second receiver configured to receive environmental sound, a temporary gain calculator configured to calculate temporary gain based on environmental sound received by second receiver, a sound type determination module configured to determine sound type of main component of audio signal received by first receiver, and a gain controller configured to stabilize temporary gain that is calculated by temporary gain calculator and set gain, when it is determined that sound type of main component of audio signal received by first receiver is music.

16 Claims, 8 Drawing Sheets

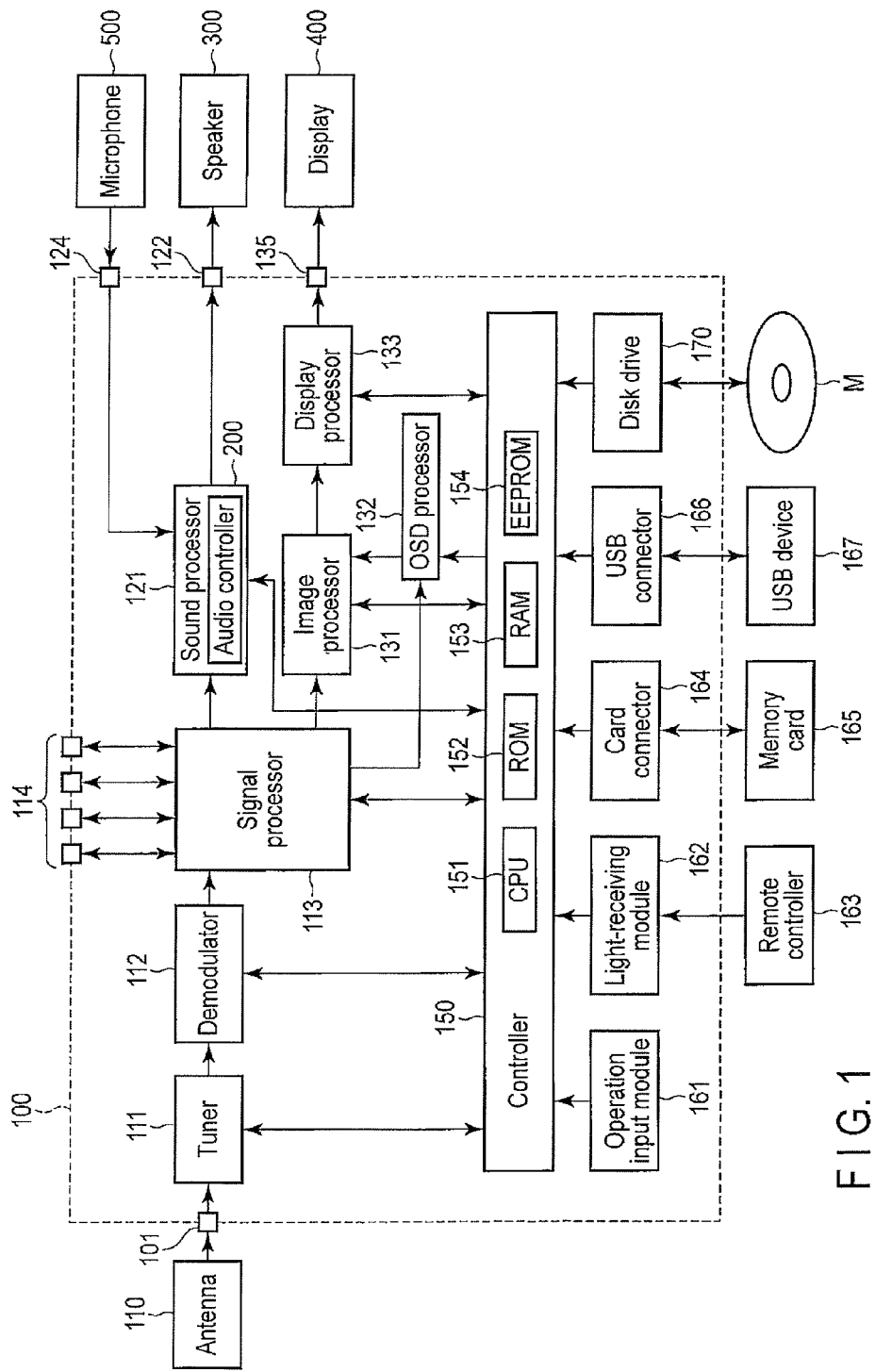
F I G. 1

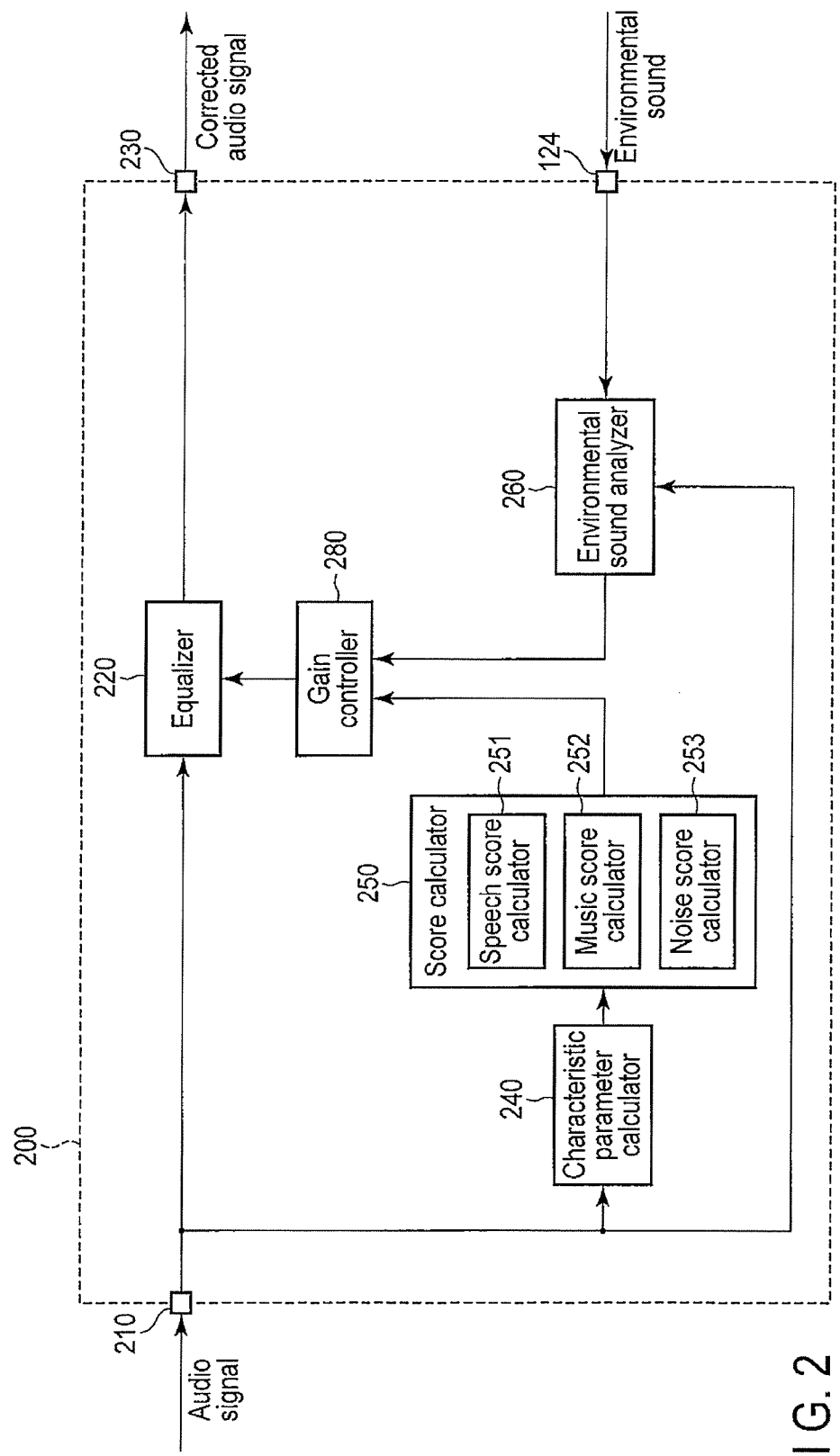
F I G. 2

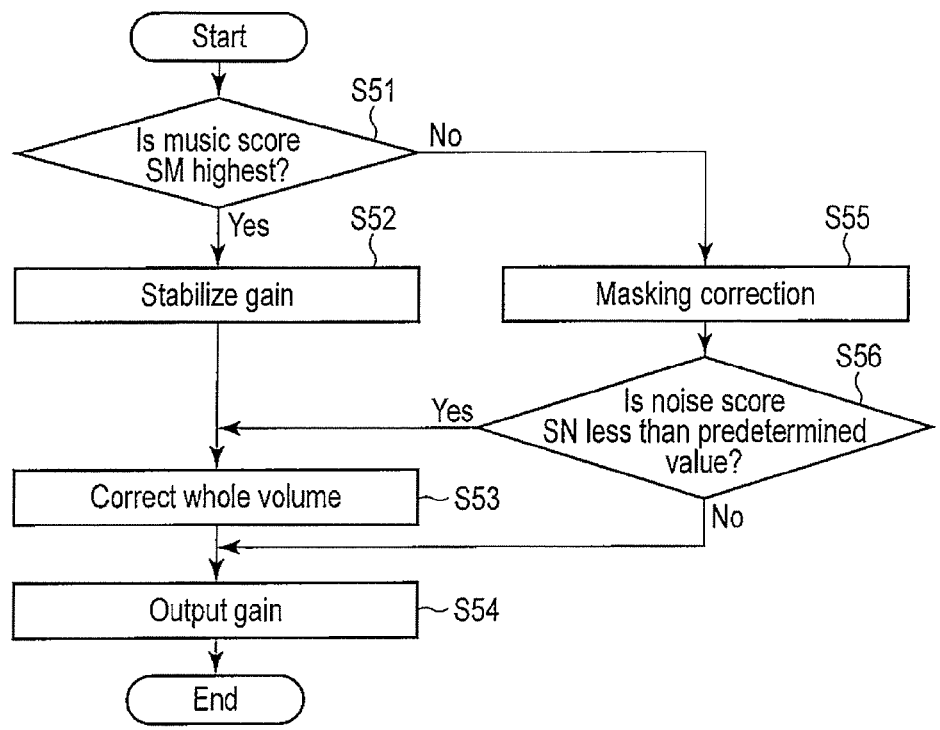
F I G. 9
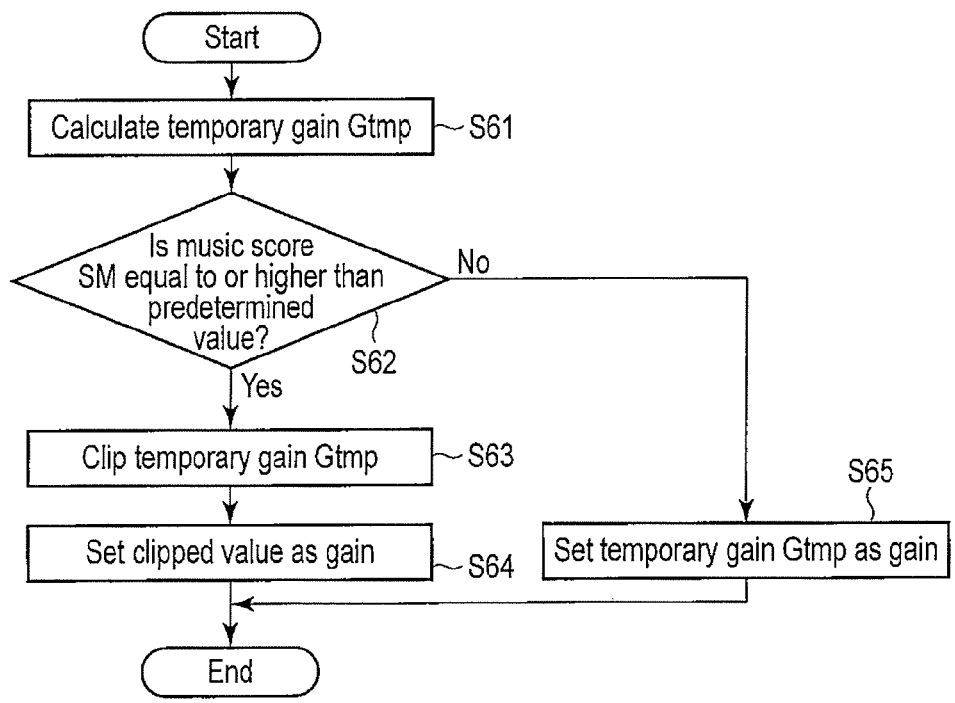
F I G. 10

AUDIO CONTROLLING APPARATUS, AUDIO CORRECTION APPARATUS, AND AUDIO CORRECTION METHOD

CROSS-REFERENCE TO RELATED APPLICATIONS

This application is based upon and claims the benefit of priority from prior Japanese Patent Application No. 2011-141098, filed Jun. 24, 2011, the entire contents of which are incorporated herein by reference.

FIELD

Embodiments described herein relate generally to an audio controlling apparatus, an audio correction apparatus, and an audio correction method.

BACKGROUND

In prior art, audio correction apparatuses which performs correction for audio signals and thereby can achieve increase in sound quality are generally known. The audio correction apparatuses detect, for example, a surrounding background noise (environmental sound), and performs sound volume control and equalizing processing according to the frequency for the audio signal, based on the detected environmental sound.

The audio correction apparatuses calculate a gain based on the level of the environmental sound for each frequency band. The audio correction apparatuses perform correction by multiplying the audio signal by the calculated gain. Specifically, the audio correction apparatuses successively determine the gain used when the audio signal is corrected, according to the level of the environmental sound. Therefore, when an environmental sound which varies with lapse of time is generated, the audio signal which is corrected by the audio correction apparatuses may provide the user with a feeling that something is wrong.

For example, when a momentary environmental sound is generated, the audio correction apparatuses abruptly change the gain. The audio correction apparatuses abruptly correct the audio signal based on the calculated gain. As a result, there is the problem that the corrected audio signal may provide the user with a feeling that something is wrong.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary view for explaining a broadcasting receiver according to an embodiment.

FIG. 2 is an exemplary view for explaining an audio controller according to the embodiment.

FIG. 9 is an exemplary view for explaining processing performed by the audio controller according to the embodiment.

FIG. 10 is an exemplary view for explaining processing performed by the audio controller according to the embodiment.

DETAILED DESCRIPTION

Figure 3:
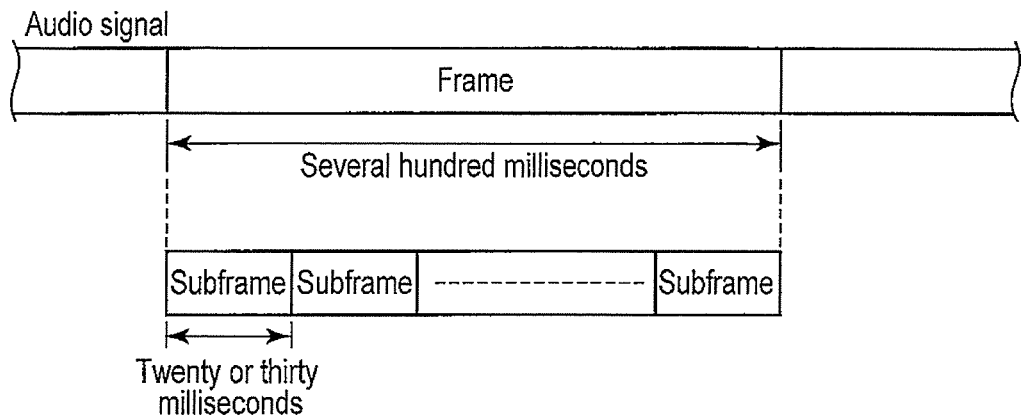
FIG. 3 is an exemplary view for explaining processing performed by the audio controller according to the embodiment.

Various embodiments will be described hereinafter with reference to the accompanying drawings. In general, according to one embodiment, an audio controlling apparatus is provided connected to an audio correction apparatus that includes an audio correction module that corrects an audio signal. The audio controlling apparatus includes a first receiver configured to receive the audio signal, a second receiver configured to receive an environmental sound, a temporary gain calculator configured to calculate a temporary gain based on the environmental sound received by the second receiver, a sound type determination module configured to determine a sound type of a main component of the audio signal received by the first receiver, a gain controller configured to stabilize the temporary gain that is calculated by the temporary gain calculator and set a gain, when it is determined that the sound type of the main component of the audio signal received by the first receiver is music, and an output module configured to output the gain that is set by the gain controller to the audio correction module of the audio correction apparatus.

An audio controlling apparatus, an audio correction apparatus, and an audio correction method according to an embodiment will be explained in detail hereinafter with reference to drawings.

FIG. 1 illustrates an example of a broadcasting receiver 100 according to an embodiment.

In the present embodiment, suppose that the broadcasting receiver 100 displays an image on a liquid crystal display device based on content.

The broadcasting receiver 100 comprises a broadcasting input terminal 101, a tuner 111, a demodulator 112, a signal processor 113, a communication interface 114, a sound processor 121, a sound output terminal 122, an environmental sound input terminal 124, an image processor 131, an OSD processor 132, a display processor 133, an image output terminal 135, a controller 150, an operation input module 161, a light-receiving module 162, a card connector 164, a USB connector 166, and a disk drive 170.

The broadcasting input terminal 101 is an input terminal, to which digital broadcasting signals that are received by, for example, an antenna 110 is inputted. The antenna 110 receives, for example, ground-wave digital broadcasting signals, BS (broadcasting satellite) digital broadcasting signals, and/or 110° CS (communication satellite) digital broadcasting signals. Specifically, contents such as programs that are supplied by broadcasting signals are inputted to the broadcasting input terminal 101.

The broadcasting input terminal 101 supplies the received digital broadcasting signals to the tuner 111. The tuner 111 is a digital broadcasting signal tuner. The tuner 111 performs tuning (selection) of the digital broadcasting signals supplied from the antenna 110. The tuner 111 transmits a tuned digital broadcasting signal to the demodulator 112.

The demodulator 112 demodulates the received digital broadcasting signal. The demodulator 112 inputs the demodulated digital broadcasting signal (content) to the signal processor 113. Specifically, the antenna 110, the tuner 111, and the demodulator 112 function as receiving means for receiving content.

The signal processor 113 functions as signal processing means for performing signal processing on the digital broadcasting signal (moving-image content data). The signal processor 113 performs signal processing on the digital broadcasting signal supplied from the demodulator 112. Specifically, the signal processor 113 divides the digital broadcasting signal into an image signal, a sound signal, and another data signal. The signal processor 113 supplies the sound signal to the sound processor 121. In addition, the signal processor 113 supplies the image signal to the image processor 131. The signal processor 113 also supplies the data signal to the controller 150 and/or the OSD processor 132.

The communication interface 114 includes an interface, such as an HDMI (High Definition Multimedia Interface), which can receive content. The communication interface 114 receives multiplex content, which includes a digital image signal and a digital sound signal, from another apparatus. The communication interface 114 supplies a digital signal (content) received from another apparatus to the signal processor 113. Specifically, the communication interface 114 functions as receiving means for receiving content.

The signal processor 113 performs signal processing on the digital signal that is received from the communication interface 114. For example, the signal processor 113 divides the digital signal into a digital image signal, a digital sound signal, and a data signal. The signal processor 113 supplies the digital sound signal to the sound processor 121. In addition, the signal processor 113 supplies the digital image signal to the image processor 131. The signal processor 113 also supplies the data signal to the controller 150 and/or the OSD processor 132.

The signal processor 113 selects one of the content which is inputted to the communication interface 114, and the content which is inputted to the broadcasting input terminal 101, and performs signal processing on the selected content. Specifically, the signal processor 113 performs signal dividing processing on one of the digital broadcasting signal and the digital signal.

The sound processor 121 converts the digital sound signal received from the signal processor 113 into a signal (audio signal) of a format which can be played back by a speaker 300. The sound processor 121 outputs the audio signal to the sound output terminal 122. The sound output terminal 122 outputs the supplied audio signal to the outside of the apparatus. Thereby, the speaker 300 which is connected to the sound output terminal 122 plays back sound based on the supplied audio signal.

The audio signal includes various types of sounds according to the content. For example, the audio signal such as a TV program includes a signal based on a speech (speech) generated by a person, music (music), and various noises (background noise). The noise in this case includes, for example, applause, cheers, and other various noises.

The environmental sound input terminal 124 is a terminal to which a device which detects sound, such as a microphone 500, is connected. The microphone 500 is provided in the vicinity of the broadcasting receiver 100, detects surrounding sound (background noise) around the broadcasting receiver 100, and converts the sound into a signal. The microphone 500 supplies the signal to the environmental sound input terminal 124. The environmental sound input terminal 124 supplies the signal supplied from the microphone 500 as environmental sound to the sound processor 121.

The image processor 131 converts an image signal received from the signal processor 113 into an image signal of a format which can be played back by a display 400. Specifically, the image processor 131 decodes (plays back) the image signal received from the signal processor 113 into an image signal of a format which can be played back by the display 400. In addition, the image processor 131 superposes the OSD signal which is supplied from the OSD processor 132 on the image signal. The image processor 131 outputs the image signal to the display processor 133.

The OSD processor 132 generates an OSD signal to display a GUI (Graphic User Interface) picture, subtitles, time, and other information on the screen, based on the data signal supplied from the signal processor 113, and/or the control signal supplied from the controller 150.

The display processor 133 performs image quality control processing for color, brightness, sharpness, contrast, and other properties, on the received image signal, based on control from the controller 150. The display controller 133 outputs the image signal which has been subjected to image quality control to the image output terminal 135. Thereby, the display 400 which is connected to the image output terminal 135 displays an image based on the supplied image signal.

The display 400 includes, for example, a liquid crystal display device which includes a liquid crystal display panel that includes a plurality of pixels that are arranged in rows and columns, and a backlight that illuminates the liquid crystal panel. The display 400 displays an image based on the image signal supplied from the broadcasting receiver 100.

The broadcasting receiver 100 may have a structure in which the display 400 is included in the receiver, instead of the image output terminal 135. The broadcasting receiver 100 may have a structure in which the speaker 300 is included in the receiver, instead of the sound output terminal 122.

The controller 150 functions as control means for controlling operations of the modules in the broadcasting receiver 100. The controller 150 includes a CPU 151, a ROM 152, a RAM 153, and an EEPROM 154. The controller 150 performs various processing, based on an operation signal supplied from the operation input module 161.

The CPU 151 includes an operation unit which executes various operation processing. The CPU 151 realizes various functions by executing programs stored in the ROM 152 or the EEPROM 154.

The ROM 152 stores a program to control the broadcasting receiver 100, and programs to execute various functions. The CPU 151 starts a program stored in the ROM 152, based on an operation signal supplied from the operation input module 161. Thereby, the controller 150 controls operations of the modules.

The RAM 153 functions as a work memory of the CPU 151. Specifically, the RAM 153 stores an operation result of the CPU 151, and data read by the CPU 151.

The EEPROM 154 is a nonvolatile memory which stores various setting information items and programs.

The operation input module 161 is input means which includes operation keys, a keyboard, a mouse, a touch pad, or another input device which can generate an operation signal in response to an operation. For example, the operation input module 161 generates an operation signal in response to an operation. The operation input module 161 supplies the generated operation signal to the controller 150.

The touch pad includes an electrostatic sensor, a thermo sensor, or a device which generates positional information based on another method. When the broadcasting receiver 100 includes the display 400, the operation input module 161 may have a structure of including a touch panel which is formed as one unitary piece with the display 400.

The light-receiving module 162 includes, for example, a sensor which receives an operation signal from a remote controller 163. The light-receiving module 162 supplies the received operation signal to the controller 150. The remote controller 163 generates an operation signal based on a user's operation. The remote controller 163 transmits the generated operation signal to the light-receiving module 162 by infrared communication. The light-receiving module 162 and the remote controller 163 may have a structure of performing transmission/reception of the operation signal by another wireless communication such as radio communication.

The card connector 164 is an interface to perform communication with, for example, a memory card 165 which stores moving-image content. The card connector 164 reads out moving-image content data from the connected memory card 165, and supplies the content data to the controller 150.

The USB connector 166 is an interface to perform communication with a USB device 167. The USB connector 166 supplies a signal supplied from the connected USB device 167 to the controller 150.

For example, when the USB device 167 is an operation input device such as a keyboard, the USB connector 166 receives an operation signal from the USB device 167. The USB connector 166 supplies the received operation signal to the controller 150. In this case, the controller 150 executes various processing, based on the operation signal supplied from the USB connector 166.

In addition, for example, when the USB device 167 is a storage device which stores moving-image content data, the USB connector 166 can obtain the content from the USB device 167. The USB connector 166 supplies the obtained content to the controller 150.

The disk drive 170 includes a drive to which an optical disk M, such as a compact disk (CD), a digital versatile disk (DVD), a Blu-ray disk (registered trademark), and another optical disk which can store moving-image content data, can be attached. The disk drive 170 reads out content from the attached optical disk M, and supplies the read content to the controller 150.

The broadcasting receiver 100 also includes a power source (not shown). The power source supplies electric power to the modules of the broadcasting receiver 100. The power source converts electric power which is supplied through an AC adaptor or the like, and supplies the electric power to the modules. The power source may include a battery. In such a case, the power source charges the battery with electric power supplied through the AC adaptor or the like. The power source supplies the electric power stored in the battery to the modules of the broadcasting receiver 100.

The broadcasting receiver 100 may also include another interface. The interface is, for example, a Serial-ATA, or a LAN port. The broadcasting receiver 100 can obtain and play back content which is stored in a device that is connected by the interface. The broadcasting receiver 100 can output a played-back audio signal and image signal to a device connected by the interface.

When the broadcasting receiver 100 is connected to a network through the interface, the broadcasting receiver 100 can obtain and play back moving-image content data on the network.

In addition, the broadcasting receiver 100 may include a storage device such as a hard disk (HDD), a solid state disk (SDD), and a semiconductor memory. When the storage device stores moving-image content data, the broadcasting receiver 100 can read out and play back the content stored in the storage device. Besides, the broadcasting receiver 100 can store a broadcasting signal, or content supplied by a network or the like, in the storage device.

The sound processor 121 includes an audio controller 200. The audio controller 200 corrects an audio signal played back by the sound processor 121. Thereby, the audio controller 200 controls the audio signal such that sound which can be heard more easily for the user is played back from the speaker 300. For example, the audio controller 200 can correct the audio signal for each frequency, based on the environmental sound supplied from the environmental sound input terminal 124 and the playback audio signal.

FIG. 2 illustrates an example of the audio controller 200 illustrated in FIG. 1.

As illustrated in FIG. 2, the audio controller 200 includes an input terminal 210, an equalizer 220, an output terminal 230, a characteristic parameter calculator 240, a score calculator 250, an environmental sound analyzer 260, and a gain controller 280.

The audio controller 200 corrects the audio signal such that the audio signal is more easily heard by the user, based on the sound type of the audio signal and the characteristic of the environmental sound which is detected by the microphone 500 when the broadcasting receiver 100 plays back the audio signal. The environmental sound is a signal which is obtained by suppressing loop of sound outputted from the speaker 300 by an echo canceller or the like.

The input terminal 210 is receiving means for receiving an audio signal which is played back by the sound processor 121. The input terminal 210 supplies the received audio signal to the equalizer 220, the characteristic parameter calculator 240, and the environmental sound analyzer 260.

The equalizer 220 corrects the audio signal in accordance with a gain characteristic designated by the gain controller 280. The equalizer 220 transmits the corrected audio signal (corrected audio signal) to the output terminal 230.

The output terminal 230 outputs the corrected audio signal corrected by the equalizer 220. When the sound output terminal 122 is connected with the output terminal 230, the output terminal 230 outputs the corrected audio signal to the outside of the broadcasting receiver 100 through the sound output terminal 122. As a result, the speaker 300 connected to the sound output terminal 122 plays back sound based on the corrected audio signal.

The characteristic parameter calculator 240 calculates various characteristic parameters based on the audio signal. In this case, as illustrated in FIG. 3, the characteristic parameter calculator 240 divides the audio signal into a plurality of frames of several hundred milliseconds. The characteristic parameter calculator 240 further divides each frame into a plurality of subframes of twenty or thirty milliseconds.

Figure 4:
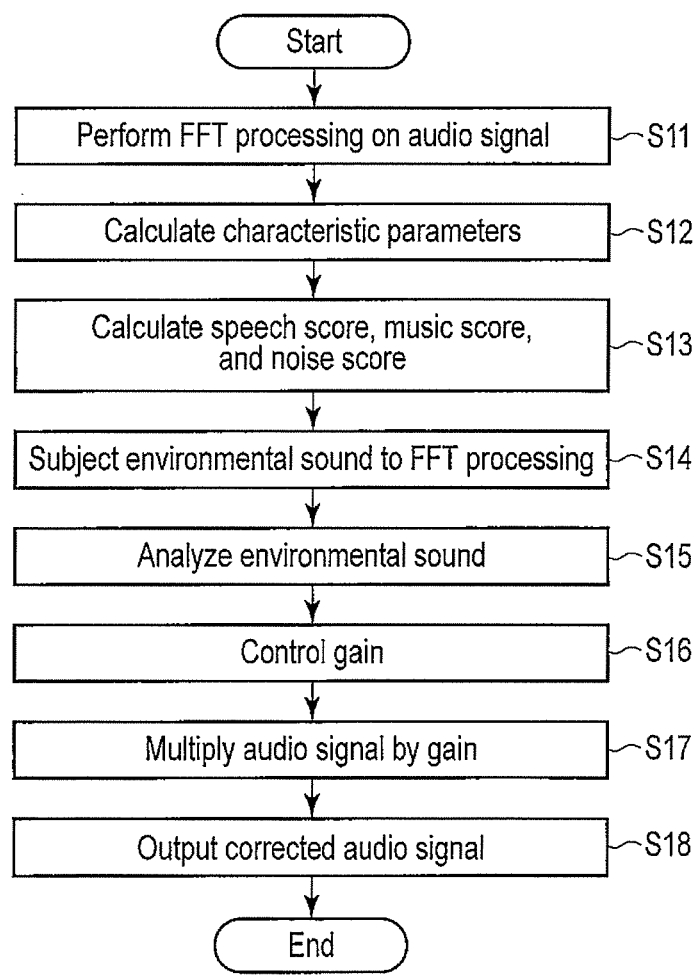
FIG. 4 is an exemplary view for explaining processing performed by the audio controller according to the embodiment.

FIG. 4 illustrates an example of operation of the audio controller 200.

First, the characteristic parameter calculator 240 of the audio controller 200 performs FFT processing (Fast Fourier Transform) on the audio signal, and calculates a frequency characteristic (Step S11). In addition, the characteristic parameter calculator 240 calculates characteristic parameters based on the above frequency characteristic and a signal characteristic in a time domain (Step S12).

The characteristic parameter calculator 240 calculates various characteristic parameters for each subframe. Therefore, the characteristic parameter calculator 240 obtains discrimination information for generating various characteristic parameters for each subframe. The characteristic parameter calculator 240 calculates statistics of the obtained discrimination information for each frame, and thereby calculates characteristic parameters.

Specifically, the characteristic parameter calculator 240 obtains discrimination information to distinguish the speech signal and the music signal for each subframe from the audio signal. In addition, the characteristic parameter calculator 240 obtains discrimination information to distinguish the music signal from noise for each subframe from the audio signal. The characteristic parameter calculator 240 also obtains various discrimination information items to distinguish the speech and music signals from the noise signal for each subframe from the audio signal.

For example, the characteristic parameter calculator 240 calculates statistics (for example, average, distribution, maximum, and minimum) for each frame based on the obtained various discrimination information items. Thereby, the characteristic parameter calculator 240 calculates various characteristic parameters.

For example, the characteristic parameter calculator 240 calculates various characteristic parameters to distinguish the speech signal from the music signal, based on the discrimination information. In addition, the characteristic parameter calculator 240 calculates various characteristic parameters to distinguish the music signal from noise based on the discrimination information. The characteristic parameter calculator 240 also calculates various characteristic parameters to distinguish the speech and music signals from the noise signal based on the discrimination information.

For example, the characteristic parameter calculator 240 calculates a sum of squares (power value) of the signal amplitude of the audio signal for each subframe, as discrimination information. The characteristic parameter calculator 240 calculates statistics for each frame based on the calculated power value, and thereby generates a characteristic parameter pw relating to the power value.

The characteristic parameter calculator 240 also calculates a zero-cross frequency of the audio signal for each subframe as discrimination information. The zero-cross frequency is the number of times with which the audio signal crosses zero in the amplitude direction, when the horizontal axis indicates time and the vertical axis indicates amplitude. The characteristic parameter calculator 240 calculates statistics for each frame based on the calculated zero-cross frequency, and thereby generates a characteristic parameter zc relating to the zero-cross frequency.

In addition, the characteristic parameter calculator 240 calculates spectral variation in a frequency region of the audio signal for each subframe, as discrimination information. The characteristic parameter calculator 240 calculates statistics for each frame based on the calculated spectral variation, and thereby generates a characteristic parameter sf relating to spectral variation.

The characteristic parameter calculator 240 also calculates a power ratio (LR power ratio) of left and right (LR) signals of 2-channel stereo in the audio signal for each subframe, as distinction information. The characteristic parameter calculator 240 calculates statistics for each frame based on the calculated LR power ratio, and thereby generates a characteristic parameter lr relating to the LR power ratio.

The characteristic parameter calculator 240 also calculates spectral flatness of the audio signal for each subframe, as discrimination information. The characteristic parameter calculator 240 calculates statistics for each frame based on the calculated spectral flatness, and thereby generates a characteristic parameter SFM relating to the noise signal.

The characteristic parameter pw relating to the power value indicates a difference in signal power between subframes. For example, the characteristic parameter pw indicates distribution of the power value between subframes. When the main component of the audio signal is speech, the difference in signal power between subframes tends to be large. Specifically, when the main component of the audio signal is speech, the value of the characteristic parameter pw increases.

The characteristic parameter zc relating to the zero-cross frequency indicates variation of the number of times with which the audio signal crosses zero in the amplitude direction, when the horizontal axis indicates time and the vertical axis indicates amplitude, as described above. In the speech signal, the zero-cross frequency is high in a consonant, and the zero-cross frequency is low in a vowel. Specifically, when the main component of the audio signal is speech, distribution of the value of the characteristic parameter zc relating to the zero-cross frequency between subframes tends to increase.

The characteristic parameter sf relating to the spectral variation indicates spectral variation in the frequency region of the audio signal for each subframe, as described above. The speech signal has sharper variations in frequency characteristics than that of the music signal. Therefore, when the main component of the audio signal is speech, distribution of the characteristic parameter sf relating to the spectral variation tends to be large.

The characteristic parameter lr relating to the LR power ratio indicates a power ratio (LR power ratio) of left and right (LR) signals of 2-channel stereo in the audio signal for each subframe, as described above. In the music signal, performances of musical instruments other than the vocal are often localized other than the center. Therefore, when the main component of the audio signal is music, the power ratio between the left and right channels tends to increase.

The characteristic parameter SFM relating to the noise signal is a parameter based on the spectral flatness of the audio signal for each subframe, as described above. The noise signal tends to form a flat spectrum. Therefore, when the main component of the audio signal is noise, distribution of the audio signal between subframes tends to decrease.

The characteristic parameter calculator 240 supplies the generated various characteristic parameters to the score calculator 250.

The score calculator 250 calculates a speech score SS, a music score SM, and a noise score SN, based on the above characteristic parameters (Step S13).

The score calculator 250 calculates a speech and music discrimination score S1 which indicates whether the audio signal is close to speech or music, based on the various characteristic parameters supplied from the characteristic parameters 240. The score calculator 250 also calculates a music and background sound discrimination score S2 which indicates whether the audio signal is close to music or background noise, based on the various characteristic parameters supplied from the characteristic parameter calculator 240.

The score calculator 250 includes a speech score calculator 251, a music score calculator 252, and a noise score calculator 253. The score calculator 250 calculates the speech score SS, the music score SM, and the noise score SM, by the speech score calculator 251, the music score calculator 252, and the noise score calculator 253, respectively. The score calculator 250 calculates the speech score SS, the music score SM, and the noise score SN, based on the speech and music discrimination score S1 and the music and background sound discrimination score S2. The score calculator 250 supplies the calculated speech score SS, the music score SM, and the noise score SN to the gain controller 280.

The environmental sound analyzer 260 subjects the environmental sound received by the environmental sound input terminal 124 to FFT processing, and thereby calculates a frequency characteristic (Step S14). In addition, the environmental sound analyzer 260 analyzes the environmental sound (Step S15). For example, the environmental sound analyzer 260 compares the frequency characteristic with the audio signal, and supplies a comparison result to the gain controller 280. In addition, for example, the environmental sound analyzer 260 regularizes the environmental sound, and supplies the regularized value as a power value Pmic to the gain controller 280.

The gain controller 280 controls the gain in accordance with the main component of the audio signal, based on the speech score SS, the music score SM, and the noise score SN which are supplied from the score calculator 250, and the comparison result supplied from the environmental sound analyzer 260 (Step S16). Thereby, the gain controller 280 determines the gain. The gain controller 280 supplies the gain to the equalizer 220.

The equalizer 220 corrects the audio signal, based on the gain supplied from the gain controller 280, as described above. Specifically, the equalizer 220 multiplies the audio signal by the gain (Step S17), and thereby obtains a corrected audio signal. The equalizer 220 outputs the corrected audio signal (Step S18).

Next, operation of the score calculator 250 will be explained hereinafter in detail.

For example, the score calculator 250 calculates the speech and music discrimination score S1 and the music and background sound discrimination score S2, by using a linear discrimination function. However, the score calculator 250 may use any method other than the linear discrimination function.

The score calculator 250 stores in advance weight coefficients A and B to be multiplied by the various characteristic parameters which are necessary for calculating the speech and music discrimination score S1 and the music and background sound discrimination score S2. The weight coefficients of a larger value are provided for a characteristic parameter which has larger effect for identifying the sound type. Specifically, the weight coefficients A and B are stored in advance for each characteristic parameter used for calculation of the scores.

The score calculator 250 selects a plurality of characteristic parameters (characteristic parameter set) to be used for calculation of the speech and music discrimination score S1, from the various characteristic parameters calculated by the characteristic parameter calculator 240. The characteristic parameter set is represented by, for example, a vector x.

When the characteristic parameter set x includes n characteristic parameters, the speech and music discrimination score S1 is calculated by "S1=A0+A1·x1+A2·x2+ . . . +An·xn".

The score calculator 250 also selects a plurality of characteristic parameters (characteristic parameter set) to be used for calculation of the music and background sound discrimination score S2, from the various characteristic parameters calculated by the characteristic parameter calculator 240. The characteristic parameter set is represented by, for example, a vector y.

When the characteristic parameter set y includes m characteristic parameters, the music and background sound discrimination score S2 is calculated by "S2=B0+B1·y1+B2·y2+ . . . +Bm·ym".

The coefficient A is set such that the difference between the speech and music discrimination score S1 and 1.0 is minimum when the main component of the audio signal is music, and the difference between the speech and music discrimination score S1 and −1.0 is minimum when the main component of the audio signal is speech.

The coefficient B is set such that the difference between the music and background sound discrimination score S2 and 1.0 is minimum when the main component of the audio signal is music, and the difference between the music and background sound discrimination score S2 and −1.0 is minimum when the main component of the audio signal is background sound.

Figure 5:
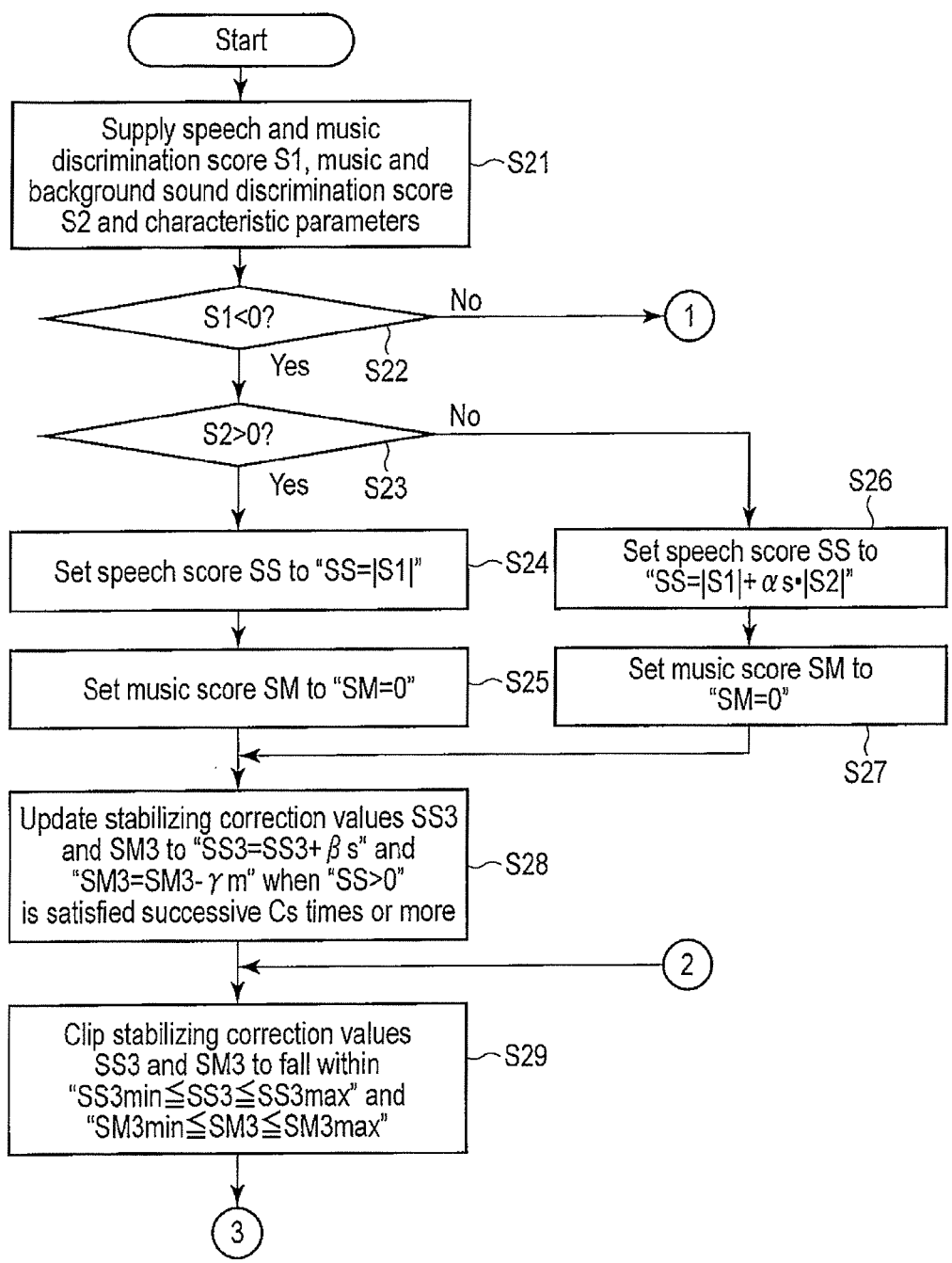
FIG. 5 is an exemplary view for explaining processing performed by the audio controller according to the embodiment.
Figure 6:
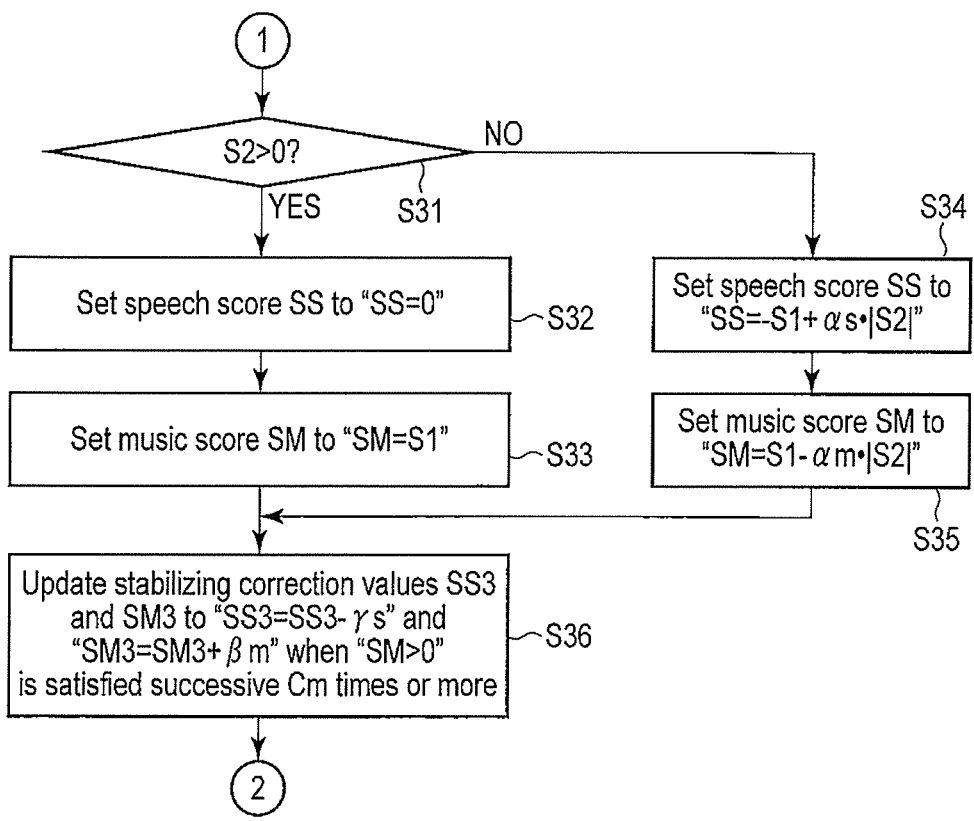
FIG. 6 is an exemplary view for explaining processing performed by the audio controller according to the embodiment.
Figure 7:
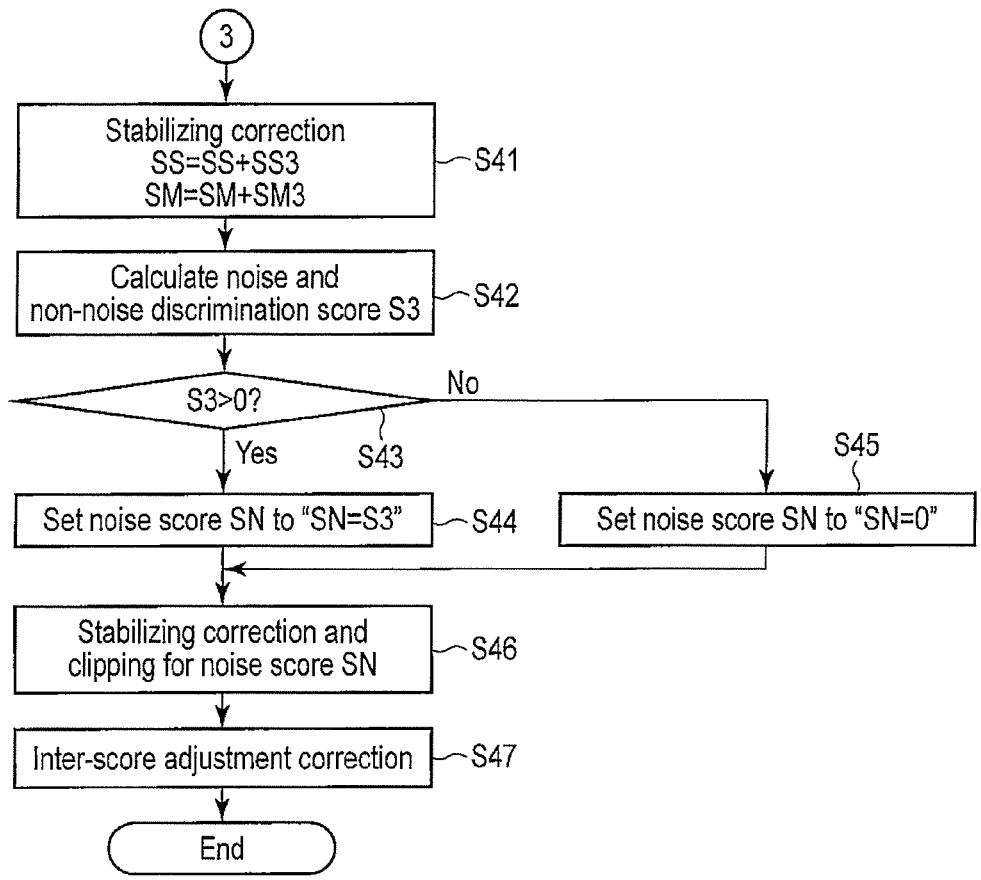
FIG. 7 is an exemplary view for explaining processing performed by the audio controller according to the embodiment.

FIG. 5 to FIG. 7 illustrate an example of processing performed by the audio controller 200.

The score calculator 250 calculates the speech and music discrimination score S1 and the music and background sound discrimination score S2, based on the various characteristic parameters supplied from the characteristic parameter calculator 240 (Step S21).

The score calculator 250 determines whether the speech and music discrimination score S1 is a negative number or not (Step S22). When it is determined at Step S22 that the speech and music discrimination score S1 is a negative number, the score calculator 250 determines whether the music and background sound discrimination score S2 is a positive number or not (Step S23).

When it is determined at Step S23 that the music and background sound discrimination score S2 is a positive number, the speech score calculator 251 of the score calculator 250 sets the speech score SS as the absolute value of the speech and music discrimination score S1 (Step S24). In addition, the music score calculator 252 of the score calculator 250 sets the music score SM to "0" (Step S25).

When it is determined at Step S23 that the music and background sound discrimination score S2 is not a positive number, the speech score calculator 251 of the score calculator 250 sets the speech score SS to "SS=|S1|+αs·|S2|" (Step S2.6). Specifically, the speech score calculator 251 adds a value obtained by correcting the absolute value of the music and background sound discrimination score S2 by a preset coefficient αs to the absolute value of the speech and music discrimination score S1, to take the speech component included in the background noise included in the audio signal into consideration. In addition, the music score calculator 252 of the score calculator 250 sets the music score SM to "0" (Step S27).

The score calculator 250 updates correction values (stabilizing correction values) SS3 and SM3 to stabilize the speech score SS and the music score SM, respectively, which are calculated at Step S24 to Step S27 (Step S28). For example, when the speech score SS is a positive number (SS>0) successive Cs times or more, the score calculator 250 updates the stabilizing correction value SS3 and the stabilizing correction value SM3.

In this case, the score calculator 250 updates the stabilizing correction value SS3 to a value (SS3+βs) which is obtained by adding a preset predetermined stabilizing coefficient βs to the already calculated stabilizing correction value SS3, as a new stabilizing correction value SS3. In addition, the score calculator 250 updates the stabilizing correction value SM3 to a value (SM3-γm) which is obtained by subtracting a preset predetermined stabilizing coefficient γm from the already calculated stabilizing correction value SM3, as a new stabilizing correction value SM3.

When it is determined at Step S22 that the speech and music discrimination score S1 is not a negative number, the score calculator 250 goes to Step S31 of FIG. 6. The score calculator 250 determines whether the music and background sound discrimination score S2 is a positive number or not (Step S31).

When it is determined at Step S31 that the music and background sound discrimination score S2 is a positive number, the speech score calculator 251 of the score calculator 250 sets the speech score SS to "0" (Step S32). In addition, the music score calculator 252 of the score calculator 250 sets the music score SM as the speech and music discrimination score S1 (Step S33).

When it is determined at Step S31 that the music and background sound discrimination score S2 is not a positive number, the speech score calculator 251 of the score calculator 250 sets the speech score SS to "SS=-S1+αs·|S2|" (Step S34). Specifically, the speech score calculator 251 adds a value, which is obtained by correcting the absolute value of the music and background sound discrimination score S2 by a preset coefficient αs, to a negative number (-S1) of the speech and music discrimination score S1, to take the speech component included in background noise included in the audio signal into consideration.

In addition, the music score calculator 252 of the score calculator 250 sets the music score SM to "SM=S1-αm·|S2|" (Step S35). Specifically, the music score calculator 252 subtracts a value, which is obtained by correcting the absolute value of the music and background sound discrimination score S2 by a preset coefficient αm, from the speech and music discrimination score S1, to take the music component included in background noise included in the audio signal into consideration.

The score calculator 250 updates the correction values (stabilizing correction values) SS3 and SM3 to stabilize the speech score SS and the music score SM calculated at Step S32 to Step S35 (Step S36). For example, when the music score SM is a positive number (SM>0) successive Cm times or more, the score calculator 250 updates the stabilizing correction value SS3 and the stabilizing correction value SM3.

In this case, the score calculator 250 updates the stabilizing correction value SS3 to a value (SS3-γs) which is obtained by subtracting a preset predetermined stabilizing coefficient γs from the already calculated stabilizing correction value SS3, as a new stabilizing correction value SS3. In addition, the score calculator 250 updates the stabilizing correction value SM3 to a value (SM3+βm) which is obtained by adding a preset predetermined stabilizing coefficient βm to the already calculated stabilizing correction value SM3, as a new stabilizing correction value SM3.

In addition, the score calculator 250 clips the stabilizing correction value SS3 and the stabilizing correction value SM3 updated at Step S28 of FIG. 5 and Step S36 of FIG. 6 (Step S29). Thereby, the score calculator 250 controls the stabilizing correction value SS3 and the stabilizing correction value SM3 to fall within a predetermined range. For example, the score calculator 250 performs control such that the stabilizing correction value SS3 has a value which falls within a range "SS3 min≤SS3≤SS3 max". In addition, for example, the score calculator 250 performs control such that the stabilizing correction value SM3 has a value which falls within a range "SM3 min≤SM3≤SM3 max".

Then, the score calculator 250 goes to Step S41 of FIG. 7. The score calculator 250 stabilizes the speech score SS and the music score SM, based on the stabilizing correction value SS3 and the stabilizing correction value SM3 clipped at Step S36 (Step S41). For example, the score calculator 250 adds the stabilizing correction value SS3 to the already calculated speech score SS. The score calculator 250 also adds the stabilizing correction value SM3 to the already calculated music score SM.

The score calculator 250 calculates a noise and non-noise discrimination score S3 (Step S42). For example, the score calculator 250 calculates statistics of the characteristic parameter SFM, and thereby generates the noise and non-noise discrimination score S3. In this case, the score calculator 250 calculates the noise and non-noise discrimination score S3, based on the spectral flatness for each of a plurality of frequency bands (low range, middle range, high range).

The score calculator 250 determines whether the noise and non-noise discrimination score S3 is a positive number or not (Step S43). When it is determined at Step S43 that the noise and non-noise discrimination score S3 is a positive number, the noise score calculator 253 of the score calculator 250 sets the noise score SN as the noise and non-noise discrimination score S3 (Step S44).

When it is determined at Step S43 that the noise and non-noise discrimination score S3 is not a positive number, the noise score calculator 253 of the score calculator 250 sets the noise score SN to "0" (Step S45).

In addition, the score calculator 250 performs stabilizing correction and clipping for the noise score SN set at Step S46 (Step S46).

The score calculator 250 performs inter-score adjustment correction (Step S47). Specifically, the score calculator 250 adjusts balance between the speech score SS, the music score SM, and the noise score SN. For example, when the music score SM and the noise score SN are larger than preset values, the score calculator 250 corrects the music score SM to reduce the music score SM in accordance with the noise score SN.

The score calculator 250 supplies the speech score SS, the music score SM, and the noise score SN calculated by the above method to the gain controller 280.

The environmental sound analyzer 260 calculates a masking level, based on the environmental sound received by the environmental sound input terminal 124 and a preset masking characteristic. The masking characteristic is obtained by numerically expressing human ears' sensitivity for sound for each frequency. For example, the environmental sound analyzer 260 performs time-frequency transform on a signal of the environmental sound, and calculates a frequency characteristic of the environmental sound. The environmental sound analyzer 260 superposes the masking characteristic on the frequency characteristic of the environmental sound, and thereby calculates a masking level.

In addition, the environmental sound analyzer 260 calculates a masking gain for each frequency, based on the masking level and the audio signal. Thereby, the environmental sound analyzer 260 calculates a masking gain to correct the audio signal such that the audio signal is not buried in the environmental sound.

Figure 8:
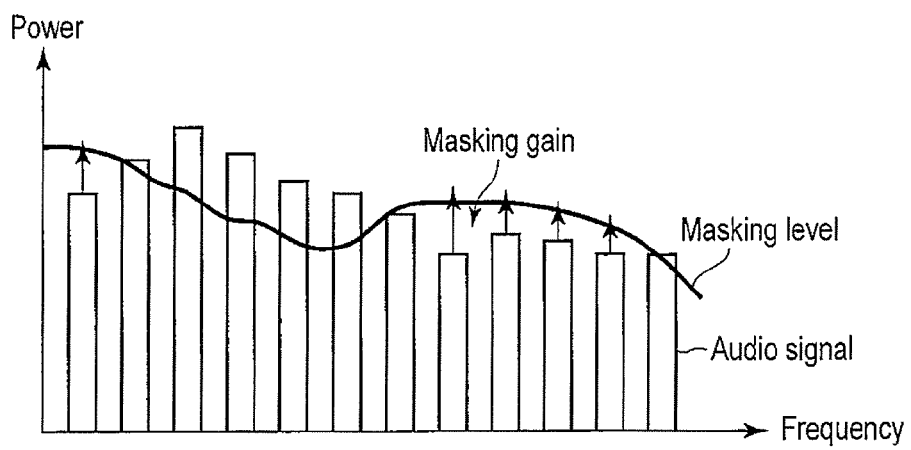
FIG. 8 is an exemplary view for explaining processing performed by the audio controller according to the embodiment.

As illustrated in FIG. 8, the environmental sound analyzer 260 superposes the masking level on the frequency characteristic (power) of the audio signal. The environmental sound analyzer 260 calculates a gain (masking gain) to correct the frequency characteristic of the audio signal to a value equal to or higher than the masking level, for each frequency band.

The environmental sound analyzer 260 supplies the calculated masking gains to the gain controller 280.

Next, operation of the gain controller 280 will be explained in detail hereinafter.

FIG. 9 illustrates an example of operation of the gain controller 280.

FIG. 9 illustrates an example of gain control shown by Step S16 of FIG. 4. The gain controller 280 receives the speech score SS, the music score SM, and the noise score SN supplied from the score calculator 250. The gain controller 280 also receives the regularized environmental sound Pmic from the environmental sound analyzer 260.

The gain controller 280 determines a sound type which is dominant in the audio signal. Specifically, the gain controller 280 determines a sound type which is dominant in the audio signal, based on the speech score SS, the music score SM, and the noise score SN supplied from the score calculator 250.

The gain controller 280 determines whether the music score SM is highest or not (Step S51). Specifically, the gain controller 280 compares the speech score SS, the music score MM and the noise score SN, and determines whether the music score SM is highest or not. When it is determined that the music score SM is highest, the gain controller 280 determines that music is dominant. Specifically, the gain controller 280 determines that music is the main component of the audio signal.

When it is determined at Step S51 that music is dominant, the gain controller 280 performs gain stabilizing processing described later (Step S52). Thereby, the gain controller 280 calculates a stabilized gain. When the music component is dominant, it is effective to increase the volume to change the playback sound to be heard more easily. When the sound has high followability to an environmental sound which greatly fluctuates, however, the volume of the music fluctuates, and the music is difficult to hear. Therefore, in this case, it is desirable to stabilize the gain value to be corrected.

In addition, the gain controller 280 corrects the gain of the whole bands to be large (Step S53). For example, the gain controller 280 corrects the gain such that the volume of the whole bands increases in accordance with the average intensity of the environmental sound.

The gain controller 280 outputs the corrected gain to the equalizer 220 (Step S54).

When it is determined at Step S51 that music is not dominant, the gain controller 280 performs masking correction (Step S55). Specifically, the gain controller 280 sets the masking gain which is supplied from the environmental sound analyzer 260, as the gain.

In addition, the gain controller 280 determines whether the noise score SN is less than a preset threshold level or not (Step S56). When it is determined that the noise score SN is less than the preset threshold level, the gain controller 280 goes to Step S53. When it is determined that the noise score SN is equal to or higher than the preset threshold level, the gain controller 280 goes to Step S54.

Thereby, the gain controller 280 can perform control such that the gain is further increased when the noise is small. In addition, when the noise is large, the gain controller 280 outputs the predetermined gain without any processing. As a result, the gain controller 280 can control the gain in accordance with intensity of the noise. The gain controller 280 may have a structure of amplifying the predetermined gain at a percentage smaller than that adopted at Step S53, when the noise is large. When a noise component as well as human speech is included in the playback sound itself, these noise components are amplified by increasing the volume, and thereby the sound becomes difficult to hear. Therefore, although the whole volume is increased when it is found that the noise score of the playback sound is not large, the whole volume is not increased or moderately increased when the noise score is large. Therefore, appropriate volume control can be performed according to the content of the playback sound.

FIG. 10 illustrates an example of gain stabilizing processing.

The gain controller 280 performs gain stabilizing processing, and thereby suppresses fluctuations of the value of the gain to be multiplied by the audio signal in which music is dominant.

First, the gain controller 280 calculates a temporary gain Gtmp (Step S61). For example, when the power of the regularized environmental sound supplied from the environmental sound analyzer 260 is Pmic and a preset coefficient is α, the gain controller 280 calculates the temporary gain Gtmp based on the following numerical expression 1.

$$G_{tmp} = 10^{\frac{Pmic \times \alpha}{20}}$$ [Expression 1]

The gain controller 280 determines whether the music score SM is equal to or higher than a preset threshold level ThMsLv (Step S62). When it is determined at Step S62 that the music score SM is equal to or higher than the preset threshold level, the gain controller 280 clips the temporary gain Gtmp (Step S63). Specifically, when the calculated temporary gain Gtmp has a value which falls out of a preset gain range, the gain controller 280 controls the temporary gain Gtmp to fall within the preset range.

For example, when the value of the calculated temporary gain Gtmp exceeds the preset range, the gain controller 280 calculates an upper limit value of the preset range as the temporary gain Gtmp. When the value of the calculated temporary gain Gtmp is less than the preset range, the gain controller 280 calculates a lower limit value of the preset range as the temporary gain Gtmp.

The gain controller 280 may have a structure of storing a gain which is calculated based on the audio signal of the previous frame, and controlling the temporary gain Gtmp such that a difference between the stored gain and the temporary gain Gtmp is less than a preset predetermined value.

The gain controller 280 sets a value of the clipped temporary gain Gtmp as the gain (Step S64). Specifically, when it is determined that a sound type of the main component of the audio signal is music, the gain controller 280 converts the temporary gain Gtmp into a value which falls within the preset range, and sets the value as the gain.

When it is determined at Step S62 that the music score SM is less than the preset threshold level, the gain controller 280 sets the value of the temporary gain Gtmp as the gain (Step S65).

As described above, the gain controller 280 controls the value of the gain to fall within the predetermined range, when the main component of the audio signal is music and the level of the music is equal to or higher than a predetermined level. Thereby, the audio controller 200 can correct the audio signal with a stable gain. Specifically, the audio controller 200 can stabilize the corrected audio signal.

Consequently, it is possible to provide an audio controlling apparatus, an audio correction apparatus, and an audio correction method, which can realize sound with higher sound quality.

Figure 11:
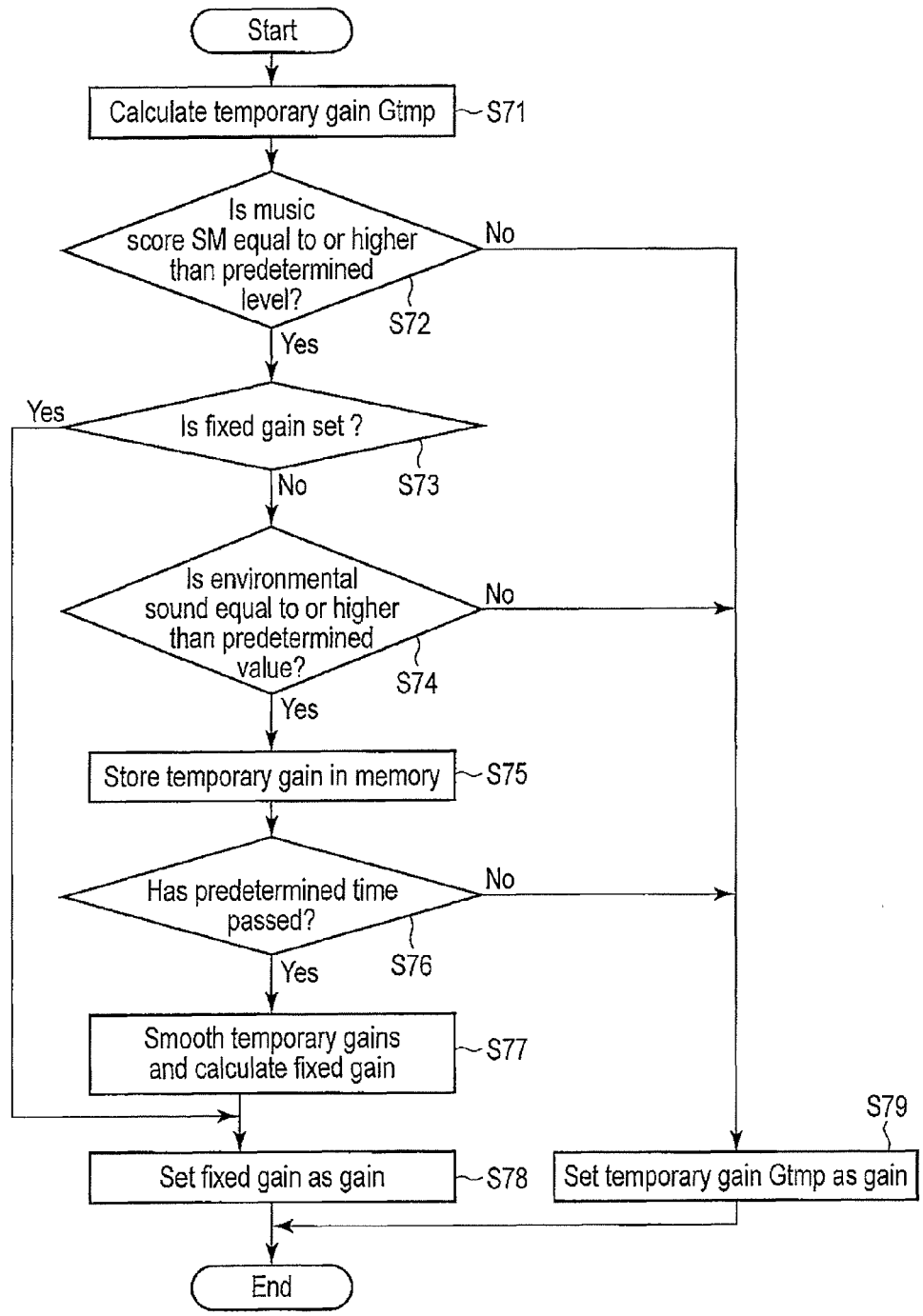
FIG. 11 is an exemplary view for explaining processing performed by the audio controller according to the embodiment.

FIG. 11 illustrates another example of the gain stabilizing processing.

The gain controller 280 performs the gain stabilizing processing, and thereby suppresses fluctuations of the value of the gain to be multiplied by the audio signal in which music is dominant.

First, the gain controller 280 calculates a temporary gain Gtmp (Step S71). For example, the gain controller 280 calculates the temporary gain Gtmp based on the above Expression 1, when the power of the regularized environmental sound supplied from the environmental sound analyzer 260 is Pmic and a preset coefficient is α.

The gain controller 280 determines whether the music score SM is equal to or higher than a preset threshold level ThMsLv or not (Step S72). When it is determined at Step S72 that the music score SM is equal to or higher than the preset threshold level, the gain controller 280 determines whether a fixed gain is not preset (Step S73). The gain controller 280 includes a memory which stores a fixed gain. The gain controller 280 determines whether a fixed gain has already been set in the memory or not. When the fixed gain has already been set, the gain controller 280 continuously uses the fixed gain which has already been set.

When it is determined at Step S73 that the fixed gain is not set, the gain controller 280 determines whether the environmental sound is equal to or higher than a preset predetermined value or not (Step S74). For example, the environmental sound analyzer 260 compares the environmental sound with the preset predetermined value, determines whether the value of the environmental sound is equal to or higher than the preset predetermined value, and supplies a comparison result to the gain controller 280. The gain controller 280 determines whether the environmental sound is equal to or higher than the preset predetermined value, based on the result supplied from the environmental sound analyzer 260.

When it is determined at Step S74 that the environmental sound is equal to or higher than the preset predetermined value, the gain controller 280 stores the calculated temporary gain Gtmp to a predetermined memory (Step S75). The gain controller 280 includes a memory to store the temporary gain Gtmp for a predetermined time. The gain controller 280 successively stores temporary gains Gtmp in the memory.

Then, the gain controller 280 determines whether a preset predetermined time has passed or not (Step S76). For example, the gain controller 280 determines whether a predetermined time has passed since the temporary gain Gtmp is first stored in the memory. The gain controller 280 may have a structure of determining whether at least a predetermined number of temporary gains Gtmp are stored in the memory or not. The gain controller 280 may have a structure of determining whether a predetermined time has passed based on the number of frames.

When it is determined at Step S76 that a preset predetermined time has passed, the gain controller 280 smoothes the temporary gains Gtmp which are stored in the memory, and calculates a fixed gain (Step S77).

The gain controller 280 sets a value of the calculated fixed gain as the gain (Step S78). For example, the gain controller 280 calculates an average value of a plurality of temporary gains Gtmp, and sets the calculated average value as fixed gain. The gain controller 280 may have a structure of calculating a median based on the temporary gains Gtmp, and setting the calculated median as fixed gain. The gain controller 280 may have a structure of calculating an average value as described above, and further calculating an average value by using a predetermined number of temporary gains Gtmp which are close to the calculated average value.

The gain controller 280 sets the value of the temporary gain Gtmp as gain, when it is determined at Step S72 that the music score SM is less than the preset threshold level ThMsLv, when it is determined at Step S74 that the environmental sound is less than the preset predetermined value, or when it is determined at Step S76 that the preset predetermined time has not passed (Step S79).

As described above, the gain controller 280 uses the temporary gain Gtmp as gain, until a predetermined time has passed. In addition, the gain controller 280 calculates a fixed gain based on the temporary gains Gtmp which are stored during a predetermined time, and uses the fixed gain as gain. According to the above structure, the gain controller 280 can use a more stable gain. Specifically, the gain controller 280 can suppress influence of a momentary environmental sound, since the temporary gain Gtmps are calculated based on change in the environmental sound during a predetermined time since the environmental sound which is not less than the predetermined value has been detected, and a fixed gain is calculated based on the calculated temporary gains Gtmp.

Thereby, the audio controller 200 can correct the audio signal by using a more stable gain. Specifically, the audio controller 200 can stabilize the corrected audio signal more effectively. Consequently, it is possible to provide an audio controlling apparatus, an audio correction apparatus, and an audio correction method, which can realize sound of higher quality.

Functions described in the above embodiment may be constituted not only with use of hardware but also with use of software, for example, by making a computer read a program which describes the functions. Alternatively, the functions each may be constituted by appropriately selecting either software or hardware.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An audio correction apparatus for correcting an audio signal, the audio correction apparatus comprising:
   a first receiver configured to receive the audio signal;
   a second receiver configured to receive an environmental sound;
   a masking gain calculator configured to calculate a masking gain, based on the environmental sound received by the second receiver and the audio signal received by the first receiver;
   a sound type determination module configured to determine a sound type of a main component of the audio signal received by the first receiver;
   a gain controller configured to:
     calculate a temporary gain based on the environmental sound received by the second receiver,
     convert the temporary gain into a first value falling within a preset range to limit fluctuations of the temporary gain, and set the first value as a corrected gain, when it is determined that the sound type of the main component of the audio signal received by the first receiver is music, and set the masking gain multiplied by a preset coefficient as the corrected gain, when it is determined that the sound type of the main component of the audio signal received by the first receiver is not music;

an equalizer configured to correct the audio signal based on the corrected gain and provide a corrected audio signal.

2. The audio correction apparatus of claim 1, wherein the gain controller is further configured to:
store a plurality of temporary gains, which are calculated by the temporary gain calculator in a preset predetermined period,
calculate a fixed gain based on the plurality of temporary gains, and
set the fixed gain as the gain.

3. The audio correction apparatus of claim 2, wherein the gain controller is further configured to store the temporary gain, when the environmental sound received by the second receiver has a level which is equal to or higher than a preset predetermined value.

4. The audio correction apparatus of claim 2, wherein the gain controller is configured to set the temporary gain as the gain for the predetermined period.

5. The audio correction apparatus of claim 2, wherein the gain controller is configured to set an average value of the plurality of temporary gains as the gain.

6. The audio correction apparatus of claim 2, wherein the gain controller is configured to set a median of the plurality of temporary gains as the gain.

7. The audio correction apparatus of claim 1, wherein the gain controller is configured to set an upper limit value of a preset range as the gain when a value of the temporary gain exceeds the preset range, and to set a lower limit value of the preset range as the gain when the value of the temporary gain is less than the preset range.

8. The audio correction apparatus of claim 1, further comprising:
a score calculator configured to calculate a score of noise which is included in the audio signal received by the first receiver,
wherein the gain controller is configured to set a value, which is obtained by increasing the masking gain based on a preset coefficient, as the gain, when the score of noise calculated by the score calculator is less than a preset predetermined value.

9. An audio correction method for correcting an audio signal by an audio correction apparatus, comprising:
receiving an audio signal with the audio correction apparatus;
receiving an environmental sound;
calculating a masking gain based on the environmental sound and the audio signal;
calculating a temporary gain based on the environmental sound;
converting the temporary gain into a first value falling within a preset range to limit fluctuations of the temporary gain;
determining a sound type of a main component of the audio signal;
setting the first value as a corrected gain, when it is determined that the sound type of the main component of the audio signal is music;
setting the masking gain multiplied by a preset coefficient as the corrected gain, when it is determined that the sound type of the main component of the audio signal is not music;
correcting the audio signal based on the corrected gain; and
outputting the corrected audio signal.

10. An audio controller for correcting an audio signal, the audio controller comprising:
a characteristic parameter calculator that calculates a first plurality of characteristic parameters based on the audio signal;
a score calculator that uses the first plurality of characteristic parameters to calculate a speech and music discrimination score, a music and background sound discrimination score, and a noise score;
if the speech and music discrimination score indicates that the main component of the audio signal is speech, then the score calculator further:
sets a music score to zero;
sets a speech score to the absolute value of the speech and music discrimination score; and
adds the absolute value of the music and background sound discrimination score multiplied by a first preset coefficient as to the speech score if the music and background sound discrimination score indicates that the main component of the audio signal is background sound;
if the speech and music discrimination score and the music and background sound discrimination score both indicate that the main component of the audio signal is music, then the score calculator further:
sets the speech score to zero; and
sets the music score to the absolute value of the speech and music discrimination score;
if the speech and music discrimination score indicates that the main component of the audio signal is music and the music and background sound discrimination score indicates that the main component of the audio signal is background sound, then the score calculator further:
sets the speech score to the absolute value of the music and background sound discrimination score multiplied by the preset coefficient, minus the absolute value of the speech and music discrimination score; and
sets the music score to the absolute value of the speech and music discrimination score minus the absolute value of the music and background sound discrimination score multiplied by a second preset coefficient;
a gain controller that calculates a gain based on the speech score and the music score; and
an equalizer that corrects the audio signal based on the gain and outputs a corrected audio signal.

11. The audio controller of claim 10, wherein the score calculator further uses the first plurality of characteristic parameters to calculate a noise score, and the gain controller calculates the gain based further on the noise score.

12. The audio controller of claim 10, further comprising an environmental sound analyzer that compares an environmental sound with the audio signal to generate a comparison result, and the gain controller calculates the gain based further on the comparison result.

13. The audio controller of claim 12, wherein the score calculator further uses the first plurality of characteristic parameters to calculate a noise score, and the gain controller calculates the gain based further on the noise score.

14. The audio controller of claim 10, wherein the characteristic parameter calculator performs Fast Fourier Transform (FFT) processing on the audio signal, calculates a frequency characteristic, and calculates the first plurality of characteristic parameters based on the frequency characteristic and a signal characteristic in a time domain.

15. The audio controller of claim 10, wherein the score calculator:

selects a second plurality of characteristic parameters from the first plurality of characteristic parameters and sums the second plurality of characteristic parameters multiplied by a first plurality of predetermined coefficients to calculate the speech and music discrimination score; and selects a third plurality of characteristic parameters from the first plurality of characteristic parameters and sums the third plurality of characteristic parameters multiplied by a second plurality of predetermined coefficients to calculate the music and background sound discrimination score.

16. The audio controller of claim 10, wherein the score calculator calculates the noise score based on spectral flatness for each of a plurality of frequency bands.

* * * * *